(12) United States Patent
Pillarisetty et al.

(10) Patent No.: US 9,972,686 B2
(45) Date of Patent: May 15, 2018

(54) GERMANIUM TIN CHANNEL TRANSISTORS

(71) Applicant: Intel Corporation, Santa Clara, CA (US)

(72) Inventors: Ravi Pillarisetty, Portland, OR (US); Van H. Le, Beaverton, OR (US); Willy Rachmady, Beaverton, OR (US); Roza Kotlyar, Portland, OR (US); Marko Radosavljevic, Portland, OR (US); Han Wui Then, Portland, OR (US); Sansaptak Dasgupta, Hillsboro, OR (US); Gilbert Dewey, Beaverton, OR (US); Benjamin Chu-Kung, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/121,745

(22) PCT Filed: Mar. 27, 2014

(86) PCT No.: PCT/US2014/032022
§ 371 (c)(1),
(2) Date: Aug. 25, 2016

(87) PCT Pub. No.: WO2015/147833
PCT Pub. Date: Oct. 1, 2015

(65) Prior Publication Data
US 2017/0125527 A1 May 4, 2017

(51) Int. Cl.
*H01L 21/70* (2006.01)
*H01L 29/161* (2006.01)
(Continued)

(52) U.S. Cl.
CPC .... *H01L 29/161* (2013.01); *H01L 21/823412* (2013.01); *H01L 21/823431* (2013.01);
(Continued)

(58) Field of Classification Search
CPC .............. H01L 29/161; H01L 27/1104; H01L 27/0924; H01L 21/823412;
(Continued)

(56) References Cited

U.S. PATENT DOCUMENTS 4,885,618 A 12/1989 Schubert et al.
2011/0068407 A1* 3/2011 Yeh ................. H01L 21/823807
257/369
(Continued)

FOREIGN PATENT DOCUMENTS

| CN | 103311302 | 9/2013 |
| EM | 2701198 | 2/2014 |

OTHER PUBLICATIONS

Decision of Rejection for Taiwan Patent Application No. 104105362 dated Sep. 23, 2016, 17 pages.
(Continued)

*Primary Examiner* — Ismail Muse
(74) *Attorney, Agent, or Firm* — Green, Howard & Mughal LLP

(57) ABSTRACT

Techniques related to transistors and integrated circuits having germanium tin, systems incorporating such transistors, and methods for forming them are discussed. Such transistors include a channel region that comprises a germanium tin portion of a fin such that the fin includes a buffer layer disposed over a substrate and the germanium tin portion disposed over the buffer layer.

21 Claims, 8 Drawing Sheets

(51) Int. Cl.
    *H01L 27/11*           (2006.01)
    *H01L 29/78*           (2006.01)
    *H01L 29/165*          (2006.01)
    *H01L 21/8238*        (2006.01)
    *H01L 27/092*          (2006.01)
    *H01L 29/10*           (2006.01)
    *H01L 21/8234*        (2006.01)
    *H01L 27/088*          (2006.01)
    *H01L 29/66*           (2006.01)

(52) U.S. Cl.
    CPC ............. *H01L 21/823807* (2013.01); *H01L 21/823821* (2013.01); *H01L 27/0886* (2013.01); *H01L 27/0924* (2013.01); *H01L 27/1104* (2013.01); *H01L 29/1054* (2013.01); *H01L 29/165* (2013.01); *H01L 29/66795* (2013.01); *H01L 29/785* (2013.01); *H01L 29/7848* (2013.01)

(58) Field of Classification Search
    CPC ......... H01L 21/823807; H01L 27/0886; H01L 21/823821; H01L 29/785; H01L 29/165; H01L 29/66795; H01L 21/823431
    See application file for complete search history.

(56) References Cited

U.S. PATENT DOCUMENTS

| | | |
|---|---|---|
| 2011/0084319 A1 | 4/2011 | Zhu et al. |
| 2011/0180851 A1* | 7/2011 | Doyle ............. H01L 21/823807 257/192 |
| 2012/0001197 A1 | 1/2012 | Liaw et al. |
| 2012/0319211 A1 | 12/2012 | Dal et al. |
| 2013/0148409 A1 | 6/2013 | Chung |
| 2014/0001520 A1 | 1/2014 | Glass et al. |
| 2014/0020619 A1* | 1/2014 | Vincent ............... H01L 21/0262 117/88 |
| 2014/0027783 A1 | 1/2014 | Yin et al. |
| 2014/0027816 A1 | 1/2014 | Cea et al. |
| 2014/0054547 A1* | 2/2014 | Eneman ................ H01L 29/785 257/24 |
| 2014/0138770 A1* | 5/2014 | van Dal ............ H01L 29/66431 257/347 |
| 2015/0311125 A1* | 10/2015 | Ju ................... H01L 21/823821 257/369 |
| 2016/0141288 A1* | 5/2016 | Weng ................. H01L 21/8258 257/192 |

OTHER PUBLICATIONS

International Preliminary Report on Patentability for PCT Application No. PCT/US14/32022 dated Oct. 6, 2016, 8 pages.
International Search Report and Written Opinion for PCT Application No. PCT/US14/32022 dated Dec. 26, 2014, 11 pages.
International Search Report for PCT Application No. PCT/US14/32022 dated Dec. 26, 2014, 3 pages.
Office Action and Search Report for Taiwan Patent Application No. 104105362 dated Mar. 9, 2016, 18 pages.
Notice of Grant dated Aug. 4, 2017 for Taiwan Patent Application No. 104105362. (no translation available).
Extended European Search Report from European Patent Application No. 14886770.8 dated Oct. 19, 2017, 8 pgs.
Gong, Xiao et al., "Gate Stack Reliability of MOSFETs With High-Mobility Channel Materials: Bias Temperature Instability", IEEE Transactions on Device and Materials Reliability, IEEE Service Center, Picataway, NJ, US, vol. 13, No. 4, Dec. 1, 2013, pp. 524-533.
Yeo, Yee-Chia, "Advanced Channel and Contact Technologies for Future CMOS Devices", VLSI Technology, Systems, and Applications (VLSI-TSA), 2012 International Symposium On, IEEE, Apr. 23, 2012, pp. 1-2.

\* cited by examiner

GERMANIUM TIN CHANNEL TRANSISTORS

CLAIM OF PRIORITY

This application is a National Stage Entry of, and claims priority to, PCT Application No. PCT/US14/32022, filed on 27 Mar. 2014, titled "GERMANIUM TIN CHANNEL TRANSISTORS", which is incorporated by reference in its entirety for all purposes.

TECHNICAL FIELD

Embodiments of the invention generally relate to semiconductor transistors with enhanced channel mobility and reduced leakage, and more particularly relate to germanium tin channel transistors, devices, and manufacturing techniques.

BACKGROUND

In some implementations, transistors, such as metal-oxide-semiconductor field-effect transistors (MOSFETs) may by multi-gate devices (e.g., tri-gate transistors, FinFETs or the like). Such structures may offer the advantages of more current flow when the device is ON and less current flow when the device is OFF as compared to similar planar transistor structures, and may thereby provide greater performance and less power usage. For example, multi-gate devices may include a fin or pillar of silicon or the like that is coupled to a source, a drain, and a gate between the source and the drain. The fin or pillar may include a channel region adjacent to the gate.

Furthermore, as device improvements are sought, different materials may be implemented for the various components of the multi-gate devices. In particular, the fin or pillar may be made up of materials other than silicon in order to improve device performance. Such materials may provide increased electron and/or hole mobilities or the like to increase drive current, for example. As new materials are provided within the fin structure, subfin leakage may be a continuing problem.

As such, existing techniques do not provide for transistor structures with enhanced channel mobility and minimal or reduced leakage such as subfin leakage. Such problems may become critical as devices having increased speed, enhanced drive current, and low power consumption are needed in various applications.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
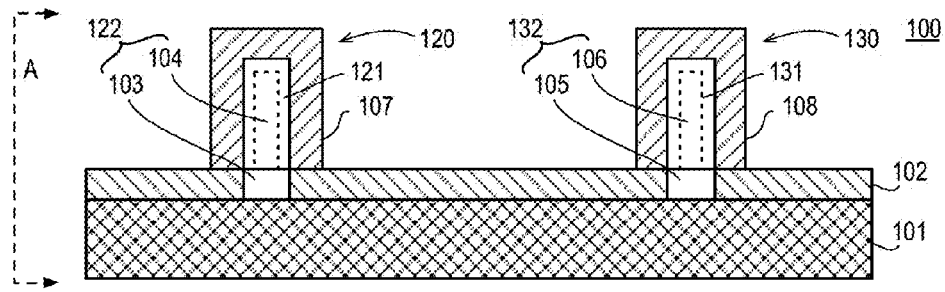
FIG. 1A is a side view of an example integrated circuit including example transistors.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not specified to be mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Transistors, integrated circuits, devices, apparatuses, computing platforms, and methods are described below related to transistors having enhanced channel mobility and minimal or reduced leakage.

As described above, it may be advantageous to provide transistors having enhanced channel mobility and minimal or reduced leakage. Such transistors may provide increased drive current and power savings. In an embodiment, a transistor may include a channel region that comprises a germanium tin (GeSn) portion of a fin. The fin may include a buffer layer disposed over a substrate and the germanium tin portion disposed over the buffer layer. The germanium tin portion may provide a high channel mobility material. The buffer layer may provide reduced leakage (e.g., subfin leakage) by providing a band offset and a valence difference with respect to the germanium tin portion of the fin. The band offset may provide an energy state barrier for containment and the valence difference may provide a momentum state or selection containment such that both may contain or confine electrons within the germanium tin portion to reduce leakage such as subfin (e.g., via the bottom of the fin) leakage. In an embodiment, the buffer layer is germanium such as a relaxed epitaxial germanium. Such a germanium layer may provide a compressive strain in the channel and may improve device performance as is discussed further herein.

In some embodiments, NMOS (N-type metal-oxide semi-conductor) and PMOS (N-type metal-oxide semiconductor) transistors may be integrated as a CMOS (complimentary metal-oxide semiconductor) circuit device such that the described devices may provide a CMOS platform for logic or memory devices or the like. The NMOS transistors and the PMOS transistors may have different concentrations of tin in the germanium tin portions of their channels such that improved performance of each may be achieved as is discussed further herein. In some embodiments, transistors may be coupled to sources and drains (e.g., raised sources and drains) that may include doped germanium tin. The NMOS transistors and the PMOS transistors may have different concentrations of tin in their sources and drains to provide variable stress (e.g., different stresses in NMOS and PMOS transistors) to improve channel performance as is also discussed further herein.

For example, in an embodiment, an integrated circuit may comprise a transistor including a channel region that comprises a germanium tin portion of a fin such that the fin includes a buffer layer disposed over a substrate and the germanium tin portion disposed over the buffer layer, a gate disposed over the channel region, and a source and a drain coupled to the fin such that the channel region is between the source and the drain. This and additional embodiments are discussed further herein with respect to the figures.

Figure 1B:
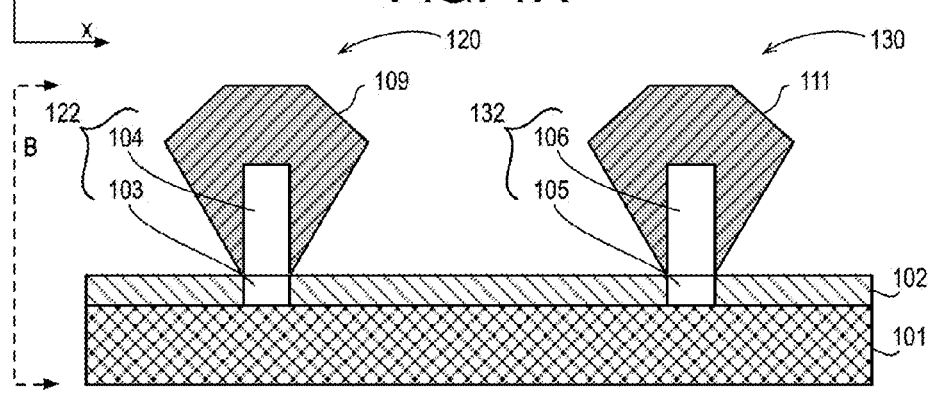
FIG. 1B is a second side view of the example transistors.
Figure 1C:
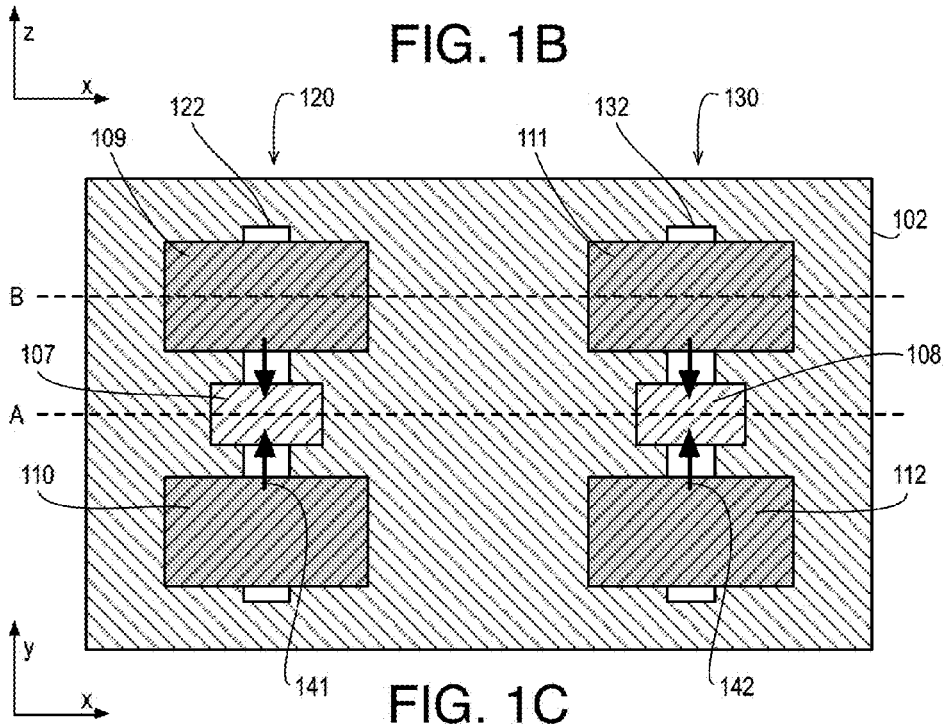
FIG. 1C is a plan view the example transistors of FIGS. 1A and 1B.

FIG. 1A is a side view of an example integrated circuit 100 including example transistors 120, 130, FIG. 1B is a second side view of example transistors 120, 130, and FIG. 1C is a plan view of example transistors 120, 130, arranged in accordance with at least some implementations of the present disclosure. As shown, FIG. 1A provides a side view taken along plane A and FIG. 1B provides a side view taken along plane B as shown in the plan view of FIG. 1C.

As shown, integrated circuit 100 may include a substrate 101 and a dielectric layer 102. In an embodiment, substrate 101 is silicon (e.g., (100) crystalline silicon). Dielectric layer 102 may include a pattern providing openings or trenches for fins as shown. In an embodiment, dielectric layer 102 is an oxide (e.g., silicon oxide). For example, transistor 120 may include a fin 122 including a buffer layer 103 and a germanium tin portion 104. Transistor 130 may include a fin 132 including a buffer layer 105 and a germanium tin portion 106. As used herein, the term fin may include both a buffer layer and a germanium tin portion (or a fin portion of a different material) or only a germanium tin portion (or a fin portion of a different material). In an embodiment, buffer layer 103 and/or buffer layer 105 include or are composed of germanium such as an epitaxially grown, crystalline, or substantially singular crystalline germanium layer or portion. In an embodiment, germanium tin portion 104 and/or germanium tin portion 106 include or are composed of an epitaxially grown, crystalline, or substantially singular crystalline germanium tin layer. As is discussed further herein, buffer layers 103, 105 and germanium tin portions 104, 106 may be epitaxially grown within a trench (e.g., a narrow or high aspect ratio trench).

Also as shown, transistor 120 may include a gate 107 and an adjacent channel region 121 of germanium tin portion 104. Transistor 130 may include a gate 108 and an adjacent channel region 131. Gates 107, 108 may provide a charge (e.g., via a gate contact, not shown) to fins 122, 132 to induce a channel within channel regions 121, 131 during the operation of transistors 120, 130. For example, gates 107, 108 may be disposed over channel regions 121, 131 of germanium tin portions 104, 106. In the plan view of FIG. 1C, channel regions 121, 131 may be obscured by gates 107, 108.

As shown in FIGS. 1B and 1C, transistor 120 may include a source 109 and a drain 110 coupled to fin 122 (e.g., via germanium tin portion 104) and transistor 130 may include a source 111 and a drain 112 coupled to fin 132 (e.g., via germanium tin portion 106). In an embodiment sources 109, 111 and drains 110, 112 may include or be composed of germanium tin. As is discussed further herein, in some examples sources 109, 111 and drains 110, 112 may be formed via a raised source and drain epitaxial growth or regrowth process.

As discussed, germanium tin portions 104, 106 may include or be composed of an epitaxial material including germanium and tin such as an alloy of germanium and tin ($Ge_{(1-x)}Sn_x$). In an embodiment, germanium tin portions 104, 106 may provide enhanced or increased electron and hole mobility for channel regions 121, 131 as compared to other channel materials. For example, germanium tin may provide a low effective mass for both NMOS and PMOS transistors allowing for high mobility and drive currents. For example, germanium tin portions 104, 106 having about 15% tin with a balance of germanium may provide increased electron and hole mobility of about 50% as compared to germanium (which, in turn, may have increased electron and hole mobility as compared to silicon, for example). Such increased mobility may provide enhanced or increased drive current for transistors 120, 130.

Germanium tin portions 104, 106 may include, for example, any amount of tin with a balance of germanium. In an embodiment, germanium tin portions 104, 106 may include not less than 3% tin (e.g., x is not less than 0.03) with a balance of germanium. In some examples, germanium tin portions 104, 106 may include 3% to 5% tin (e.g., a concentration of tin in the range of 3% to 5%; e.g., x is between 0.03 and 0.05, inclusive) with a balance of germanium. In some examples, germanium tin portions 104, 106 may include 5% to 10% tin (e.g., a concentration of tin in the range of 5% to 10%; e.g., x is between 0.05 and 0.10, inclusive) with a balance of germanium. In some examples, germanium tin portions 104, 106 may include 5% to 20% tin (e.g., a concentration of tin in the range of 5% to 20%; e.g., x is between 0.05 and 0.20, inclusive) with a balance of germanium.

Furthermore, fins 121, 131, via the inclusion of buffer layers 103, 105 and germanium tin portions 104, 106 may reduce leakage (such as subfin leakage) in transistors 120, 130. For example, buffer layers 103, 105 may include germanium. In such embodiments, a band offset (e.g. an offset in the relative alignment of the energy bands at the hetero junction between germanium and germanium tin) may exist between germanium buffer layers 103, 105 and germanium tin portions 104, 106. Such a band offset may confine or trap electrons or charge carriers (holes) and reduce, substantially reduce, or eliminate leakage in transistors 120, 130. Furthermore, a valence difference may exist between germanium buffer layers 103, 105 and germanium tin portions 104, 106. Such a valence difference or offset may also confine or trap electrons or charge carriers (holes) and reduce, substantially reduce, or eliminate leakage in transistors 120, 130. For example, the band offset may provide an energy state barrier to leakage and the valence difference or offset may provide a momentum state or "selection" barrier to leakage.

As shown in FIG. 1C, via arrows 141 associated with transistor 120 and arrows 142 associated with transistor 130, buffer layers 103, 105 may provide a compressive strain (e.g., a uniaxial compressive strain or stress) to germanium tin portions 104, 106 and thereby channel regions 121, 131. In an embodiment, buffer layers 103, 105 may include or be composed of germanium such as a relaxed epitaxial layer of germanium. As compared to germanium tin portions 104, 106 (e.g., epitaxial germanium tin), germanium buffer layers 103, 105 may have a smaller native lattice spacing and may therefore apply a compressive strain to channel regions 121, 131 as shown via arrows 141, 142.

In some examples, transistor 120 may be an NMOS transistor and transistor 130 may be a PMOS transistor, and integrated circuit 100 may be a CMOS device. In an embodiment, an NMOS transistor 120 and a PMOS transistor 130 may have the same concentrations of tin in germanium tin portions 104, 106, such as, for example, the concentrations of tin listed above. In such examples, the compressive strain to channel region 131 as illustrated via arrows 142 may enhance the performance of transistor 130 (e.g., the compressive strain may provide for a lower effective mass and better mobility in germanium tin portions 106 and a higher valence offset between germanium tin portions 106 and buffer layer 105). Furthermore, increasing the amount of tin in germanium tin portions 106 may increase the compressive strain and further enhance the performance of transistor 130.

In such examples, the performance of NMOS transistor 120 may be enhanced by some aspects of germanium tin portions 104 (e.g., enhanced or increased mobility) but may be balanced against the compressive strain as illustrated via arrows 141 (e.g., an excessive compressive strain may hinder the performance of an NMOS transistor due to a decreased band offset with respect to a germanium buffer layer 103). Therefore, in examples where the tin concentration in germanium tin portions 104, 106 are the same, a balance may be struck for the performance of NMOS and PMOS transistors. For example, the percentage of tin for both PMOS and NMOS transistors 120, 130 may be not less than 8% and not more than 12%, with a balance of germanium, with an percentage of about 10% tin being particularly advantageous.

In other examples, the concentrations of tin in germanium tin portions 104, 106 and thereby channel regions 121, 131 may be different. Continuing the example of transistor 120 being NMOS and transistor 130 being PMOS, germanium tin portion 106 (and channel region 131) may have higher concentration of tin than germanium tin portions 105 (and channel region 121). Such an embodiment may provide for enhanced performance of both NMOS and PMOS transistors. For example, germanium tin portion 104 (and channel region 121) NMOS transistor 120 may have a tin concentration in the range of 5% to 10% tin with a balance germanium and germanium tin portion 106 (and channel region 131) of PMOS transistor 130 may have a tin concentration in the range of 5% to 20% tin with a balance germanium.

Furthermore, sources 109, 111 and drains 110, 112 may include any suitable materials. In some examples, sources 109, 111 and drains 110, 112 may include an epitaxial growth such as germanium tin or doped germanium tin. In some examples, source 109 and drain 110 and/or source 111 and drain 112 may include or be composed of a different material than channel regions 121, 131. In some examples, source 109 and drain 110 may include or be composed of the same material or materials as source 111 and drain 112. In other examples, source 109 and drain 110 may include or be composed of different materials as source 111 and drain 112. For example, sources 109, 111 and drains 110, 112 may include material(s) selected to provide strain engineering to channel regions 121, 131 for improved performance.

Continuing the example of transistor 120 being NMOS and transistor 130 being PMOS, source 111 and drain 112 may include or be composed of a material that provides additional or enhanced compressive strain to channel region 131 relative to channel region 121. For example, source 111 and drain 112 may include or be composed of germanium tin having a relatively high concentration of tin (e.g., 5% to 20% or the like). Furthermore, source 111 and drain 112 may be heavily doped with a p-type dopant such as boron or the like. Source 109 and drain 110 may include or be composed of a material that provides reduced compressive strain (e.g., counteracts the compressive strain illustrated via arrows 141). For example, source 109 and drain 110 may include or be composed of germanium tin having a relatively low concentration of tin (e.g., not more than 5% tin or the like). In an embodiment, source 109 and drain 110 may include or be composed of germanium (e.g., without tin). Furthermore, source 109 and drain 110 may be heavily doped with an n-type dopant such as phosphorus or arsenic or the like.

As discussed, gates 107, 108 may be disposed over channel regions 121, 131. Gates 107, 108 may include any suitable material, materials or stack of materials for providing electrical control over channel regions 121, 131 of transistors 120, 130. In an embodiment, gates 107, 108 include an epitaxial layer of silicon adjacent to channel regions 121, 131, a high-k gate dielectric over the epitaxial layer of silicon and a metal gate portion over the high-k gate dielectric. In an embodiment, gates 107, 108 include a high-k gate dielectric adjacent to channel regions 121, 131 and a metal gate portion over the high-k gate dielectric. Furthermore, as shown in FIG. 1A, a bottom of gate 107 and/or a bottom of gate 108 may be substantially planar or flush with a top surface of buffer layer 103 and/or buffer layer 105. For example, the bottom of gate 107 may be substantially planar or flush with a top surface of buffer layer 103 such that the bottom of gate 107 is horizontally aligned (or substantially horizontally aligned) with the top surface of buffer layer 103. Such a configuration may offer the advantages of blocking leakage (e.g., such that no direct path exists between germanium tin portion 104 and dielectric layer 102 and/or substrate 101) and maximizing the size of the germanium tin channel region 121 (e.g., such that no buffer layer 103, which may not form a channel region, is adjacent to gate 107) for transistor 120 and/or likewise for transistor 130.

As discussed, NMOS and PMOS transistors having germanium tin channel regions (with the same or different compositions) may be integrated into a CMOS circuit or device. In some examples, devices having only NMOS transistors having germanium tin channel regions or devices having only PMOS transistors having germanium tin channel regions may be utilized in a device. Furthermore, NMOS and/or PMOS transistors having germanium tin channel regions (with the same or different compositions) may be integrated with NMOS and/or PMOS transistors having channel regions of other material compositions, such as germanium, silicon germanium, or silicon channel regions. In an embodiment, silicon based channel region transistors may be integrated with NMOS transistors having germanium tin channel regions. In an embodiment, silicon based channel region transistors may be integrated with PMOS transistors having germanium tin channel regions. In an embodiment, silicon based channel region transistors may be integrated with NMOS transistors and PMOS transistors having the same or similar composition germanium tin channel regions. In an embodiment, silicon based channel region transistors may be integrated with NMOS transistors and PMOS transistors having different compositions germanium tin channel regions.

Additional details associated with the described features of integrated circuit 100 and/or transistors 120, 130 are provided herein with respect to FIGS. 3A-3H and the associated discussion, which provides additional details related to the formation of integrated circuit 100 and transistors 120, 130. Furthermore, integrated circuit 100 may be implemented in an electronic device structure such as a logic device, an SRAM, or the like, as is discussed further herein.

Figure 2:
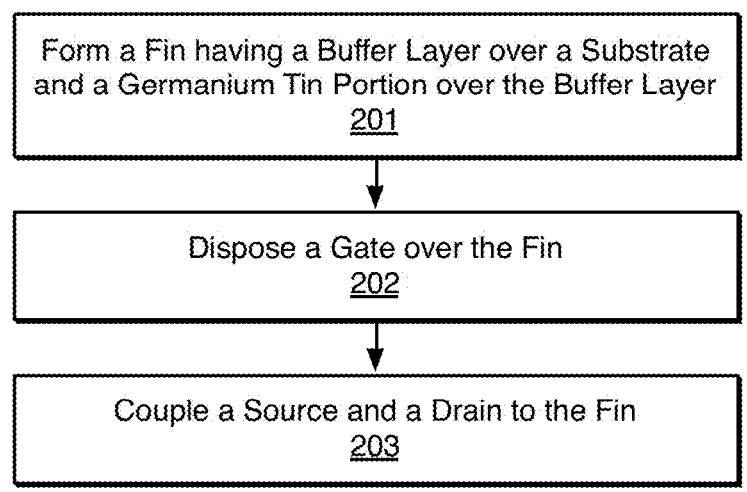
FIG. 2 is a flow diagram illustrating an example process for forming transistors having enhanced channel mobility and minimal or reduced leakage.

FIG. 2 is a flow diagram illustrating an example process 200 for forming transistors having enhanced channel mobility and minimal or reduced leakage, arranged in accordance with at least some implementations of the present disclosure. For example, process 200 may be implemented to fabricate transistor 120 and/or transistor 130 as discussed herein. In the illustrated implementation, process 200 may include one or more operations as illustrated by operations 201-204. However, embodiments herein may include additional operations, certain operations being omitted, or operations being performed out of the order provided.

Process 200 may begin at operation 201, "Form a Fin having a Buffer Layer over a Substrate and a Germanium Tin Portion over the Buffer Layer", where a fin having a buffer layer over a substrate and a germanium tin portion over the buffer layer may be formed. In an embodiment, fin 122 and/or fin 132 may be formed over substrate 101 as discussed further herein with respect to FIGS. 3A-3E and elsewhere herein. In an embodiment, fins 122, 132 may include the same or substantially the same materials and fins 122, 132 may be formed together. In another embodiment, fins 122, 132 may include different materials (e.g., different concentrations of tin in their germanium tin portions) and fins 122, 132 may be formed separately as is discussed further herein. In an embodiment, the buffer layer and the germanium tin portion may be formed in a trench via epitaxial growth techniques.

Process 200 may continue at operation 202, "Dispose a Gate over the Fin", where a gate may be formed over the fin. In an embodiment, gate 107 and/or gate 108 may be formed over fin 122 and/or fin 132, respectively, as is discussed further with respect to FIG. 3F and elsewhere herein. For example, gate 107 and/or gate 108 may include an epitaxial layer of silicon adjacent to channel regions 121, 131, a high-k gate dielectric over the epitaxial layer of silicon and a metal gate portion over the high-k gate dielectric, and gate 107 and/or gate 108 may be formed adjacent to channel region 121 and/or channel region 131 as discussed herein. For example, the gate may be formed via epitaxial growth techniques and/or blanket deposition techniques and patterning techniques.

Process 200 may continue at operation 203, "Couple a Source and a Drain to the Fin", where a source and a drain may be coupled to the fin. In an embodiment, source 109 and drain 110 may be coupled to fin 122 and/or source 111 and drain 112 may be coupled to fin 132. As discussed, in some examples source 109 and drain 110 may have the same material(s) as source 111 and drain 112 and in other examples they may have different materials. For example, the sources and drains may be formed via masking and epitaxial growth techniques. In examples where source 109 and drain 110 may have the same material(s) as source 111 and drain 112, the sources and drains may be formed in the same operation(s). In examples where source 109 and drain 110 may have different materials than source 111 and drain 112, source 109 and drain 110 may be formed while the other portions of integrated circuit are masked (including the regions associated with source 111 and drain 112), the mask may be removed, and source 111 and drain 112 may be formed while the other portions of integrated circuit are masked (including the regions associated with source 109 and drain 110). Coupling the sources and drains to the fins may include an epitaxial growth of the sources and drains for example.

As discussed, process 300 may be implemented to fabricate transistor 120 and/or transistor 130. Further details associated with such fabrication techniques are discussed herein an in particular, with respect to FIGS. 3A-3H. Any one or more of the operations of process 300 (or the operations discussed herein with respect to FIGS. 3A-3H) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Figure 3A:
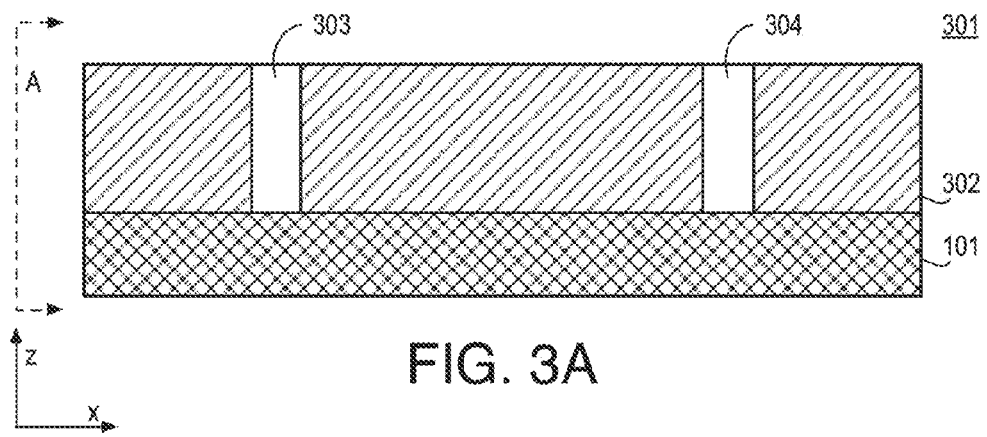
FIGS. 3A, 3B, 3C, 3D, 3E, 3F, 3G, 3H are side views of example transistor structures as particular fabrication operations are performed.

FIGS. 3A-3H are side views of example transistor structures as particular fabrication operations are performed, arranged in accordance with at least some implementations of the present disclosure. FIG. 3A illustrates side view of transistor structures taken along plane A as shown in the plan view of FIG. 1C. As shown in FIG. 3A, transistor structure 301 includes substrate 101. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In an embodiment, substrate 101 may include silicon having a (100) crystal orientation. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Also as shown in FIG. 3A, sacrificial fins 303, 304 and a dielectric layer 302 may be formed over substrate 101. For example, sacrificial fins 303, 304 may be formed via a patterning and etch of substrate 101 (e.g., sacrificial fins 303, 304 may comprise crystalline silicon) or via a material deposition and patterning of the material (e.g., polysilicon or the like). The size and shape of sacrificial fins 303, 304 may define subsequent openings that may, in turn, define the size and shape of fins 122, 132, which may be formed in trenches formed when sacrificial fins 303, 304 are removed. In an embodiment, sacrificial fins 303, 304 may have substantially vertical sidewalls as shown. In an embodiment, sacrificial fins 303, 304 may have angled sidewalls such that the bottom of sacrificial fins 303, 304 is wider than a top of sacrificial fins 303, 304. In another embodiment, the sidewalls of sacrificial fins 303, 304 may each have a curved shape such that a bottom of sacrificial fins 303, 304 is wider than a top of sacrificial fins 303, 304 and such that the sidewalls have a concave curved shape. Additional details associated with sacrificial fins 303, 304 are discussed further herein with respect to the trenches they form.

Dielectric layer 302 may include any material that may be selectively etched with respect to sacrificial fins 303, 304 and that may allow selective epitaxial growth from substrate 101 (e.g., without epitaxial growth from dielectric layer 302). Dielectric layer 302 may be formed in any suitable manner such as bulk deposition or thermal growth and planarization techniques or the like. In an embodiment, dielectric layer 302 is a silicon oxide. In some embodiments, dielectric layer 302 may include silicon nitride, silicon oxynitride, aluminum oxide, or the like. For example, dielectric layer 302 may deposited using a blanket deposition techniques such as chemical vapor deposition (CVD), plasma Enhanced chemical vapor deposition (PECVD), physical vapor deposition (PVD), molecular beam epitaxy (MBE), metalorganic chemical vapor deposition (MOCVD), atomic layer deposition (ALD), or the like, and a planar technique such as chemical mechanical polishing techniques may be used to expose sacrificial fins 303, 304.

Figure 3B:
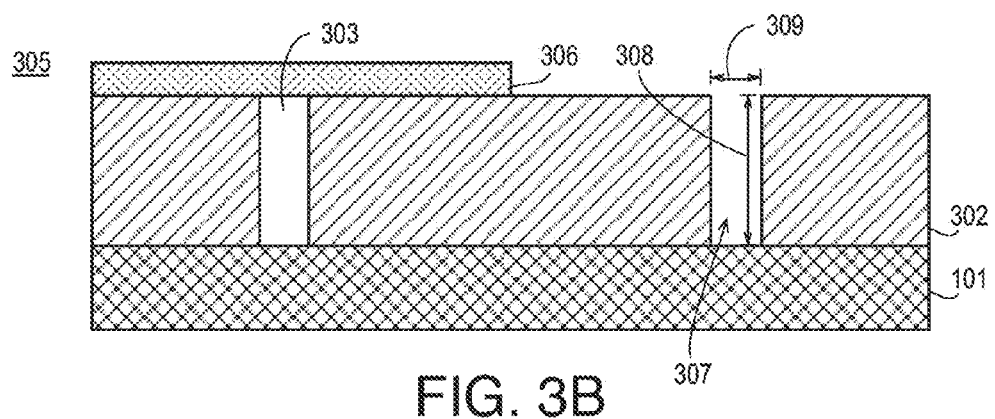

FIG. 3B illustrates a transistor structure 305 similar to transistor structure 301, after the formation of a mask 306 and removal of sacrificial fin 304 to form a trench 307. Mask 306 may be formed by any suitable technique or techniques such as photolithography techniques. Mask 306 may include a hardmask material (e.g., silicon oxide, silicon nitride, silicon oxynitride, aluminum oxide, or the like). Mask 306 may be any material that provides etch selectivity such that sacrificial fin 304 may be removed while mask 306 protects sacrificial fin 303. Sacrificial fin 304 may be removed using any suitable technique such as an etch operation. As discussed, the size and shape of sacrificial fin 304 may define the size and shape of trench 307. In various embodiments, trench 307 may have substantially vertical sidewalls, sloped sidewalls, or sloped and concave sidewalls, or the like. As shown, trench 307 may include a width 309 (e.g., a top width) and a height 308. In some embodiments, width 309 may be in the range of 8 to 20 nm. In an embodiment, width 309 may be about 10 nm. In some embodiments, height 308 may be in the range of 10 nm to 100 nm. In an embodiment, height 308 may be in the range of 30 to 100 nm. Furthermore, a ratio of height 308 to width 309 may define an aspect ratio of trench 307. In an embodiment, the aspect ratio of trench 307 may be in the range of 1.8 to 3.5. In an embodiment, the aspect ratio of trench 307 may be in the range of 2 to 3. In an embodiment, the aspect ratio of trench 307 may be about 2.5.

As discussed herein, in some embodiments, germanium tin portions 104, 106 of fins 122, 132 may have different material compositions. To form such devices, mask 306 may be formed such that sacrificial fin 304 may be selectively removed while sacrificial fin 303 remains as illustrated in FIG. 3B. In an embodiment, mask 306 may be formed such that sacrificial fin 303 may be selectively removed while sacrificial fin 304 remains. Also as discussed herein, in some embodiments, germanium tin portions 104, 106 of fins 122, 132 may have the same or substantially the same material compositions. To form such devices, mask 306 may not be implemented such that, for example, both sacrificial fin 303 and sacrificial fin 304 may be removed in the same operation to expose trench 307 and a trench (not shown) associated with the removal of sacrificial fin 303.

Figure 3C:
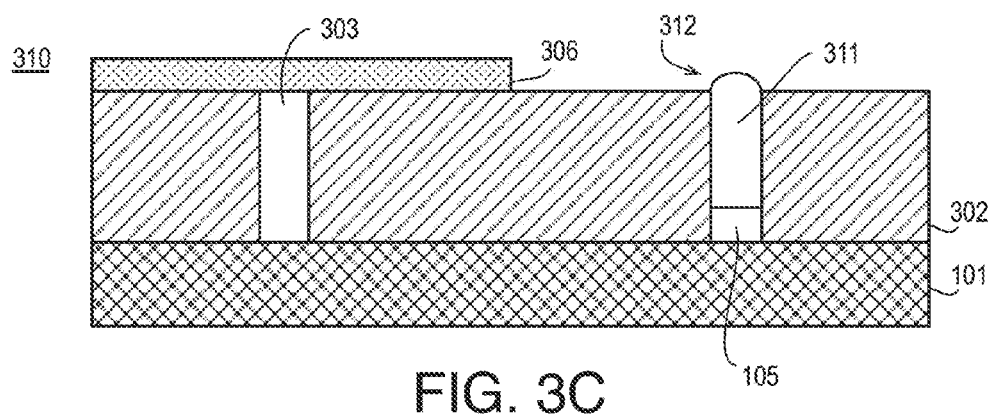

FIG. 3C illustrates a transistor structure 310 similar to transistor structure 305, after the formation of buffer layer 105 and germanium tin growth 311. Buffer layer 105 may be formed, for example, via any suitable epitaxial growth technique such as, for example, an epitaxial growth via chemical vapor deposition, metal organic chemical vapor deposition, atomic layer deposition, or any other epitaxial growth technique. Buffer layer 105 may include any suitable epitaxial layer such that buffer layer 105 may bridge any lattice mismatch germanium tin growth 311. In an embodiment, buffer layer 105 comprises germanium. In an embodiment, buffer layer 105 comprises a relaxed buffer such as a relaxed germanium.

In some embodiments, prior to epitaxial growth of buffer layer 105, a surface preparation may be performed on substrate 101. For example, a trench may be formed in substrate 101 at the bottom of trench 307. The trench may include a trench shape such as a V-groove and may include a miscut, and/or dimensions to facilitate the epitaxial growth of buffer layer 105.

Buffer layer 105 may have any suitable thickness such that buffer layer 105 may hinder or prevent the leakage current as discussed herein (e.g., via a band offset and/or valence difference with germanium tin growth 311). In an embodiment, buffer layer 105 is in the range of 3 to 30 nm. In an embodiment, buffer layer 105 may be a single layer of, for example, germanium. In an embodiment, the thickness of buffer layer 105 may be a fraction of height 308 of trench 307 such as, for example, 10% to 30% of height 308. In some examples, defects may be formed when epitaxially growing buffer layer 105 and germanium tin growth 311. In an embodiment, such defects may be substantially confined to buffer layer 105 (e.g., such that subsequent germanium tin epitaxial growth may be clean). In an embodiment, the thickness of buffer layer 105 may be selected such that defects may be confined therein. For example, such defects may be formed during the epitaxial growth and may terminate within buffer layer 105 and/or at the interface between buffer layer 105 and dielectric layer 302.

Germanium tin growth 311 may be formed using any suitable epitaxial growth technique. For example, germanium tin growth 311 may be formed by epitaxial growth via chemical vapor deposition, metal organic chemical vapor deposition, atomic layer deposition, or any other epitaxial growth technique. In an embodiment, germanium tin growth 311 may be formed by epitaxial growth within a range of 400–500° C. As shown, in some examples, a bump 312 or rounded top surface may be formed as a part of germanium tin growth 311. In some examples, bump 312 may be removed via a subsequent planar operation. In some examples, bump 312 may not be formed and germanium tin growth 311 may have a substantially flat top surface and/or any bump or irregularity may not hinder subsequent processing such that no planar operation is needed. Germanium tin growth 311 may have any suitable thickness such as 10 nm to 100 nm less the thickness of buffer layer 105 (and in some cases including bump 312) or the like as discussed with respect to height 308 of trench 307.

As discussed herein, in some embodiments, germanium tin portions 104, 106 of fins 122, 132 may have different material compositions. In an embodiment, germanium tin growth 311 may be associated with a PMOS transistor and germanium tin growth 311 may include a relatively large concentration of tin such as 5% to 20% or any other concentration as discussed herein. In another embodiment, germanium tin growth 311 may be associated with an NMOS transistor and germanium tin growth 311 may include a relatively small concentration of tin such as 5% to 10% or any other concentration as discussed herein. For example, a fin associated with either a PMOS or NMOS device may be formed first in the discussed process flow.

Also as discussed herein, in some embodiments, germanium tin portions 104, 106 of fins 122, 132 may have the same or substantially the same material compositions. As discussed, to form such devices, mask 306 may not be implemented such that, for example, buffer layer 105 (please refer to FIG. 1A) and germanium tin growth 311 and buffer layer 103 (please refer to FIG. 1A) and a germanium tin growth associated with an exposed trench (e.g., associated with a removed sacrificial fin 303 and eventual germanium tin portion 104 of fin 122) may be formed in the same operations.

Figure 3D:
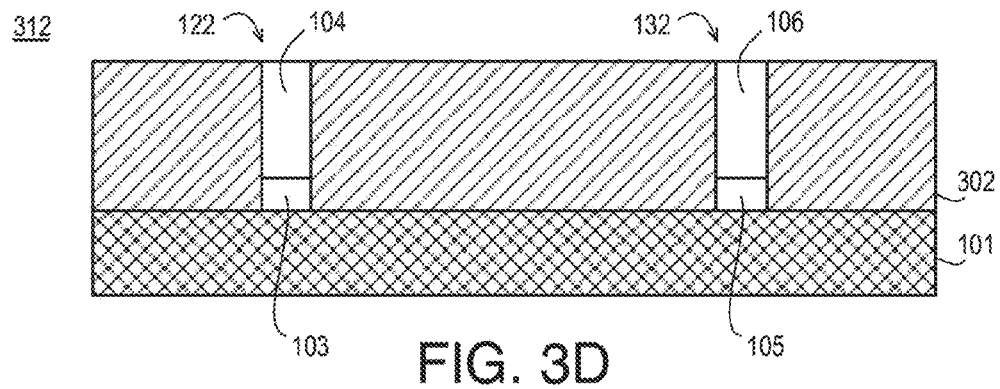

FIG. 3D illustrates a transistor structure 312 similar to transistor structure 310, after the formation of buffer layer 103 and germanium tin portion 104 of fin 122 and germanium tin portion 106 (to complete, along with buffer layer 105, fin 132). In an embodiment, forming buffer layer 103, germanium tin portion 104, and germanium tin portion 106 may include (with reference to FIG. 3C), removing mask 306, removing sacrificial fin 303, epitaxially growing buffer layer 103, epitaxially growing germanium tin portion 104, and a planarization operation. For example, such epitaxial growths may provide a bump over germanium tin portion 104 similar to bump 312, which may be removed by the planarization operation. Furthermore, such epitaxial growths may further grow bump 312, and such additional material may be similarly removed by the planarization operation. Removing mask 306 may include an etch (such as a dry etch or wet etch) technique or the like. Sacrificial fin 304 may be removed using any suitable technique such as an etch operation. The epitaxial growth of buffer layer 103 and the epitaxial growth of germanium tin portion 104 may include any epitaxial growth technique discussed herein such as chemical vapor deposition, metal organic chemical vapor deposition, atomic layer deposition, or the like. The planarization operation may include a chemical mechanical polish operation or the like. Such an embodiment may offer the advantage of reduced operations (e.g., no second masking may be required).

In another embodiment, forming buffer layer 103, germanium tin portion 104, and germanium tin portion 106 may include (again with reference to FIG. 3C) removing mask 306, forming a (second) mask over germanium tin growth 311, removing sacrificial fin 303, epitaxially growing buffer layer 103, epitaxially growing germanium tin portion 104, removing the second mask, and performing an optional planarization operation. For example, such an embodiment may eliminate additional growth over bump 312. Further, such an embodiment may eliminate the need for a planarization operation. However, in some examples, a planarization operation may still be advantageous to provide a more level surface for subsequent processing. As discussed, removing mask 306 and removing the second mask may include an etch (such as a dry etch or wet etch) technique or the like. Forming the second mask may include photolithography processing or deposition, photolithography, and etch processing, or the like. As above, sacrificial fin 304 may be removed using any suitable technique such as an etch operation. Epitaxially growing buffer layer 103 and epitaxially growing germanium tin portion 104 may include any epitaxial growth techniques discussed herein such as chemical vapor deposition, metal organic chemical vapor deposition, atomic layer deposition, or the like. The optional planarization operation may include a chemical mechanical polish operation or the like.

As discussed herein, in some embodiments, germanium tin portions 104, 106 of fins 122, 132 may have different material compositions. In an embodiment, germanium tin portion 104 (and any germanium tin growth including a bump or the like) may be associated with an NMOS transistor and germanium tin portion 104 may include a relatively small concentration of tin (as compared to germanium tin portion 106) such as 5% to 10% or any other concentration as discussed herein. In another embodiment, germanium tin portion 104 may be associated with a PMOS transistor and germanium tin portion 104 may include a relatively high concentration of tin such as 5% to 20% or any other concentration as discussed herein. For example, a fin associated with either a PMOS or NMOS device may be formed second in the discussed process flow.

Also as discussed herein, in some embodiments, germanium tin portions 104, 106 of fins 122, 132 may have the same or substantially the same material compositions. As discussed, to form such devices, masks such as mask 306 may not be implemented and buffer layers 103, 105 may be formed simultaneously and germanium tin portions 104, 106 may be simultaneously. In such examples, processing may include removing sacrificial fins 303, 304, epitaxially growing buffer layers 103, 105, epitaxially growing germanium tin growths (e.g. germanium tin growth 311) associated with germanium tin portions 104, 106, and an optional planarization step. In either embodiment, a structure as shown with respect to transistor structure 312 may be formed and processing may continue as follows.

Figure 3E:
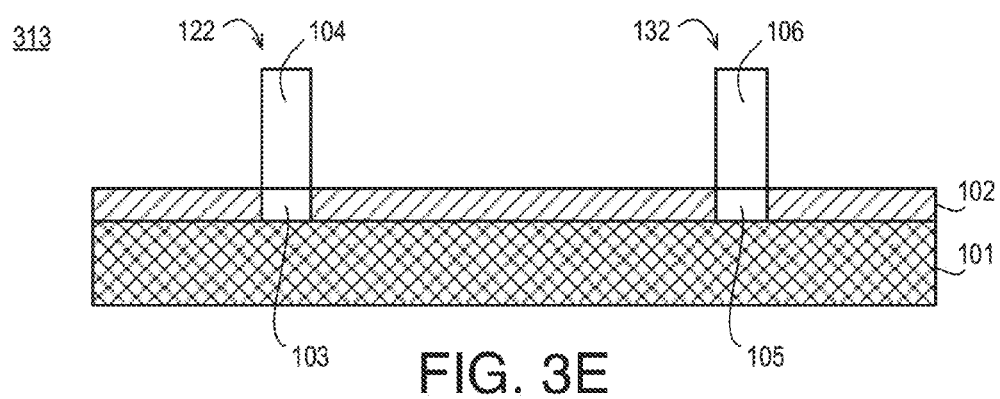

FIG. 3E illustrates a transistor structure 313 similar to transistor structure 312, after recessing dielectric layer 302 to form dielectric layer 102. As shown in FIG. 3D, in an embodiment, dielectric layer 302 may be recessed such that a top surface of buffer layer 103, a top surface of buffer layer 105, and a top surface of dielectric layer 102 are substantially planar or flush (e.g., such that the top surfaces of such layers are substantially laterally or horizontally aligned). Dielectric layer 302 may be recessed using any suitable technique or techniques such as etch operations, timed etch operations, or the like.

Figure 3F:
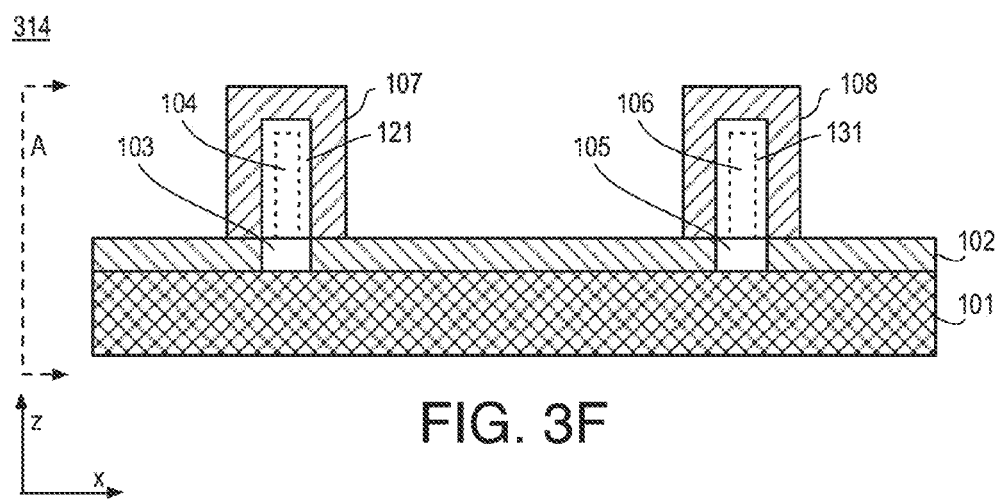

FIG. 3F illustrates a transistor structure 314 similar to transistor structure 313, after the formation of gate 107 and gate 108. Gates 107, 108 may include any suitable material, materials, or material stack. In an embodiment, gates 107, 108 include an epitaxial layer of silicon adjacent to channel regions 121, 131, a high-k gate dielectric over the epitaxial layer of silicon and a metal gate portion over the high-k gate dielectric. In an embodiment, gates 107, 108 include a high-k gate dielectric adjacent to channel regions 121, 131 and a metal gate portion over the high-k gate dielectric. Gates 107, 108 may be formed using any suitable technique or techniques such as, for example, deposition techniques (e.g., conformal or bulk depositions) and patterning techniques (e.g., photolithography and etch techniques). As shown, gates 107, 108 may be formed such that a bottom of gate 107 and/or a bottom of gate 108 may be substantially planar or flush with a top surface of buffer layer 103 and/or buffer layer 105. For example, the bottom of gate 107 may be substantially planar or flush with a top surface of buffer layer 103 such that the bottom of gate 107 is horizontally aligned (or substantially horizontally aligned) with the top surface of buffer layer 103.

Figure 3G:
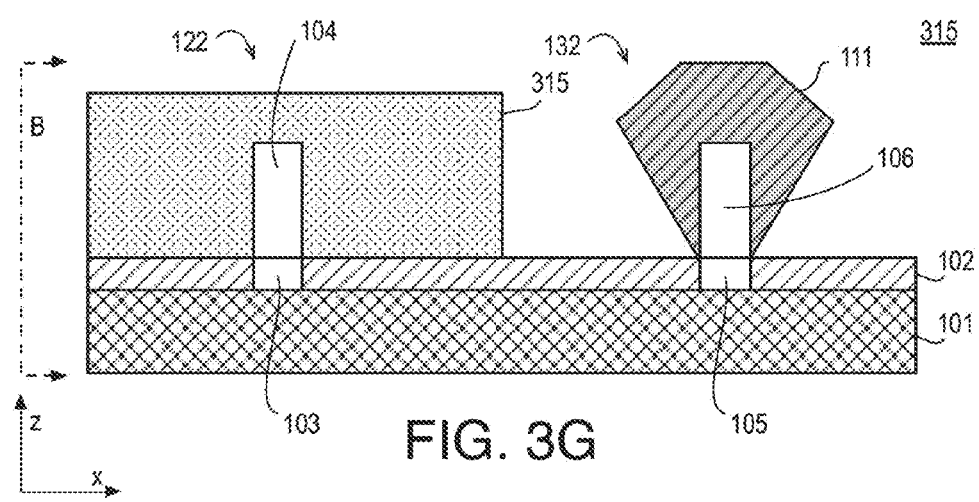

FIG. 3G illustrates a transistor structure 315 similar to transistor structure 314, after the formation of mask 315, source 111, and drain 112 (not shown in the side view of FIG. 3G). FIG. 3G illustrates side view of transistor structures taken along plane B as shown in the plan view of FIG. 1C. For example, source 111 and drain 112 may be coupled to fin 106. As shown, germanium tin portion 104 of fin 122 and other portions of transistor structure 315 may be masked by mask 315 such that source 111 and drain 112 may be selectively grown. For example, source 111 and drain 112 may be selectively grown via epitaxial growth from germanium tin portion 106 (e.g., the material of source 111 and drain 112 may not grow from dielectric layer 102). In an embodiment, source 111 and drain 112 include or are composed of germanium tin. As shown, source 111 may grow along germanium tin portion 106 with more rapid growth occurring at more exposed regions or corners or the like. Mask 315 may be formed by any suitable technique or techniques such as photolithography techniques. Mask 306 may include a hardmask material (e.g., silicon oxide, silicon nitride, silicon oxynitride, aluminum oxide, or the like). Mask 315 may be any material that provides epitaxial growth selectivity such that source 111 and drain 112 may be grown while other portions (e.g., of germanium tin portion 106 and/or germanium tin portion 104) may be protected from growth.

As discussed herein, in some embodiments, source 111 and drain 112 may have different material compositions than source 109 and drain 110. To form such devices, mask 315 may be formed such that source 111 and drain 112 may be selectively formed while germanium tin portion 104 is protected from growth. In such examples, mask 315 may provide an analogous role in an implant doping of source 111 and drain 112. For example, source 111 and drain 112 may be a part of a PMOS device. In such an embodiment, source 111 and drain 112 may include germanium tin with a relatively high percentage of tin and/or a p-type dopant such as boron or the like.

Also as discussed herein, in some embodiments, source 111 and drain 112 and source 109 and drain 110 may have the same or substantially the same material compositions. To form such devices, mask 315 may not be implemented and a mask for the formation of source 111, drain 112, source 109, and drain 110 may be implemented such that all of source 111, drain 112, source 109, and drain 110 may be formed in the same operation and may include germanium tin with substantially the same percentages of tin.

Figure 3H:
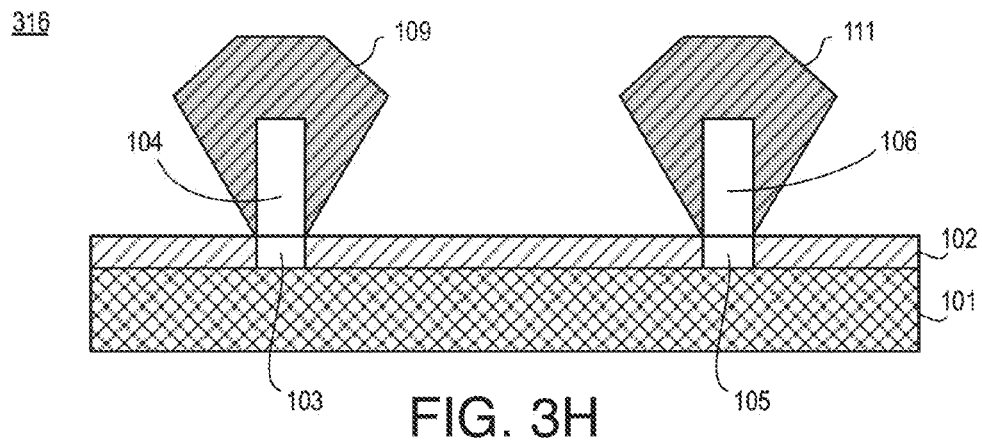

FIG. 3H illustrates a transistor structure 316 similar to transistor structure 315, after the removal of mask 315 and the formation of source 109 and drain 110 (not shown in the side view of FIG. 3H). For example, source 109 and drain 110 may be coupled to fin 104. Removing mask 315 may include an etch (such as a dry etch or wet etch) technique or the like. In an embodiment, source 109 and drain 110 may be formed by providing a second mask that covers source 111 and drain 112 and other areas where source 109 and drain 110 are not be formed, epitaxially growing source 109 and drain 110, and removing the second mask. For example, source 109 and drain 110 may be selectively grown via epitaxial growth from germanium tin portion 104 (e.g., the material of source 111 and drain 112 may not grow from dielectric layer 102). In an embodiment, source 109 and drain 110 may include or be composed of germanium tin. As shown, source 109 may grow along germanium tin portion 104 with more rapid growth occurring at more exposed regions or corners or the like.

The second mask may be formed by any suitable technique or techniques such as photolithography techniques such that the second mask includes a hardmask material as discussed. Removing the second mask may include an etch technique or the like. The second mask may include any material that provides epitaxial growth selectivity such that source 109 and drain 110 may be grown while other portions (e.g., of germanium tin portion 106 and/or germanium tin portion 104) may be protected from growth. Furthermore, the second mask may provide an analogous role in an implant doping of source 109 and drain 110. For example, source 109 and drain 110 may be a part of a NMOS device and source 109 and drain 110 may include an n-type dopant such as phosphorus or arsenic or the like.

As discussed herein, in some embodiments, source 109 and drain 110 may have different material compositions than source 111 and drain 112. For example, source 109 and drain 110 may be a part of an NMOS device as discussed and source 109 and drain 110 may include germanium tin with a relatively low percentage of tin. Also as discussed, in some embodiments, source 111, drain 112, source 109, and drain 110 may have the same or substantially the same material compositions and may be formed in the same epitaxial growth operations as discussed above.

FIGS. 3A-3H illustrate an example process flow for fabricating transistor 120 and transistor 130 as discussed herein. In various examples, additional operations may be included or certain operations may be omitted. In particular, the illustrated process may provide for transistors with channel regions having different material compositions and sources and drains having different material compositions. As discussed, some operations may be omitted and/or modified to fabricate transistors having either channel regions with the same compositions or sources and drains with the same compositions, or both.

Figure 4:
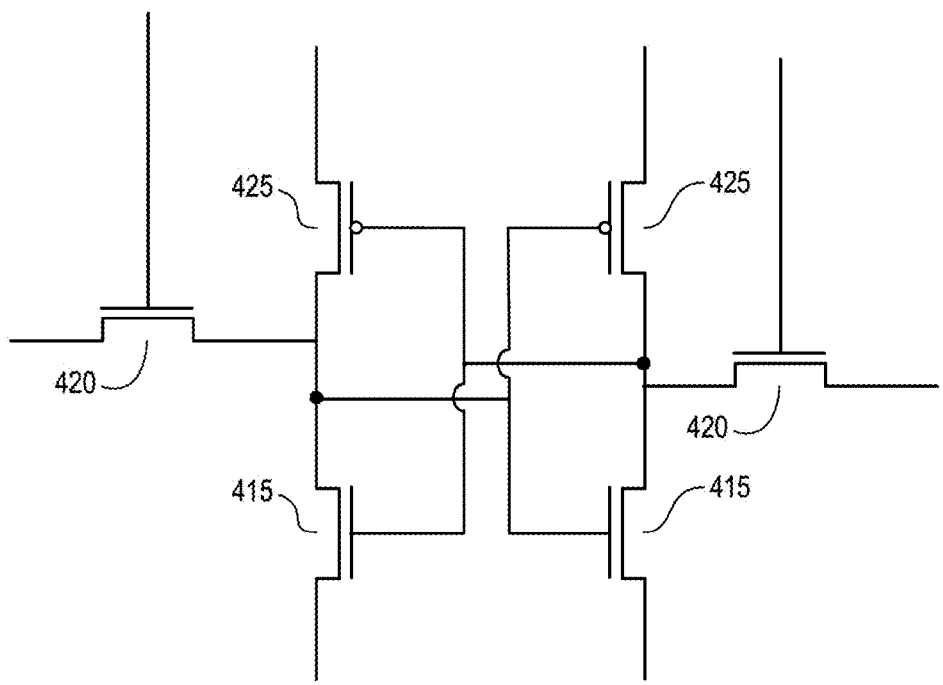
FIG. 4 is a view of an example SRAM cell implementing one or more transistors having enhanced channel mobility and minimal or reduced leakage.

FIG. 4 is a view of an example SRAM cell 400 implementing one or more transistors having enhanced channel mobility and minimal or reduced leakage, arranged in accordance with at least some implementations of the present disclosure. FIG. 4 illustrates an example 6 transistor (6T) SRAM cell 400 including access transistors 420, pull-down transistors 415, and pull-up transistors 425. In various examples, access transistors 420, pull-down transistors 415, and pull-up transistors 425 may be implemented as transistor 120 and/or 130. A complete SRAM memory circuit may be formed by interconnecting many SRAM cells such as SRAM cell 400.

In an embodiment, one or more of access transistors 420 and pull-down transistors 415 are NMOS transistors and may include features discussed with respect to NMOS transistors herein and pull-up transistors 425 are PMOS transistors and may include features discussed with respect to NMOS transistors discussed herein. For example, access transistors 420 and pull-down transistors 415 may include channel region 121 of germanium tin portion 104 of fin 122 (which may include buffer layer 103 disposed substrate 101 and germanium tin portion 104 disposed over buffer layer 103), gate 107 disposed over channel region 121, and source 109 and drain 110 coupled to fin 122 with channel region 121 between source 109 and drain 110. One or more of pull-up transistors 425 may include channel region 131 of germanium tin portion 106 of fin 132 (which may include buffer layer 104 disposed substrate 101 and germanium tin portion 106 disposed over buffer layer 104), gate 108 disposed over channel region 131, and source 111 and drain 112 coupled to fin 132 with channel region 131 between source 111 and drain 112.

Furthermore, one or more of access transistors 420 and pull-down transistors 415 (e.g., NMOS transistors) may have sources and drains including germanium tin with different tin concentrations than germanium tin sources and drains of pull-up transistors 425 (e.g., PMOS transistors). For example, pull-up transistors 425 may have sources and drains with a higher concentration of tin than the sources and drains of access transistors 420 and pull-down transistors 415. In addition or alternatively, one or more of access transistors 420 and pull-down transistors 415 (e.g., NMOS transistors) may have channel regions of germanium tin with a different tin concentration than that of germanium tin channel regions of pull-up transistors 425 (e.g., PMOS transistors). For example, pull-up transistors 425 may have channel regions of germanium tin with a higher concentration of tin than the channel regions of access transistors 420 and pull-down transistors 415. For example, channel regions of pull-up transistors 425 may have a concentration of tin in the range of 5% to 20% and channel regions of access transistors 420 and pull-down transistors 415 may have a concentration of tin in the range of 5% to 10%.

Figure 5:
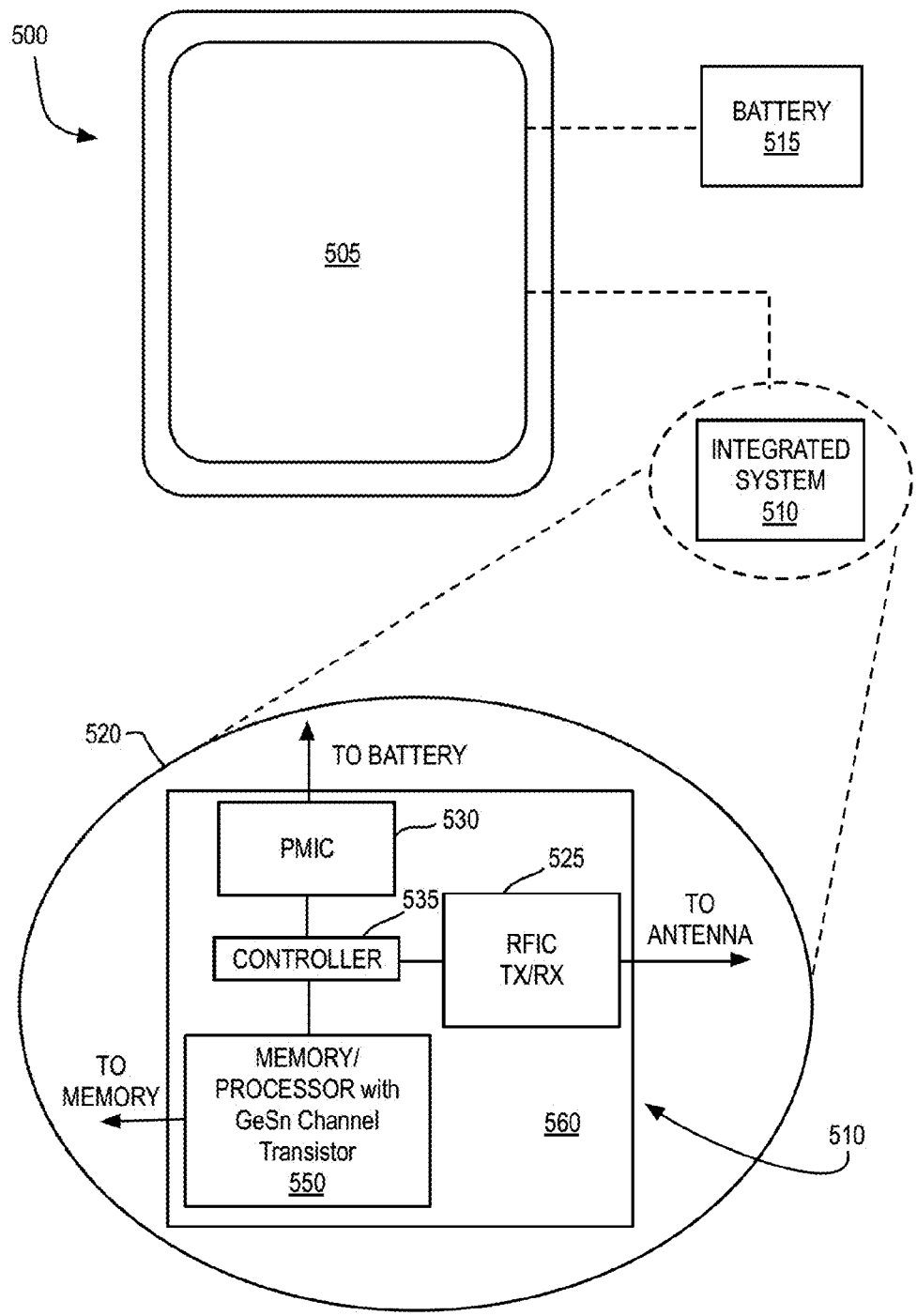
FIG. 5 is an illustrative diagram of a mobile computing platform employing an integrated circuit with transistor(s) having enhanced channel mobility and minimal or reduced leakage.

FIG. 5 is an illustrative diagram of a mobile computing platform 500 employing an IC with transistor(s) with germanium tin (GeSn) channel(s), arranged in accordance with at least some implementations of the present disclosure. A transistor or transistors having germanium tin channel(s) may be any transistors as discussed herein such as transistor 120 or transistor 130 or the like. In some examples, NMOS and PMOS transistors as discussed herein may be implemented together as a CMOS circuit. Mobile computing platform 500 may be any portable device configured for each of electronic data display, electronic data processing, wireless electronic data transmission, or the like. For example, mobile computing platform 500 may be any of a tablet, a smart phone, a netbook, a laptop computer, etc. and may include a display screen 505, which in the exemplary embodiment is a touchscreen (e.g., capacitive, inductive, resistive, etc. touchscreen), a chip-level (SoC) or package-level integrated system 510, and a battery 515.

Integrated system 510 is further illustrated in the expanded view 520. In the exemplary embodiment, packaged device 550 (labeled "Memory/Processor" in FIG. 6) includes at least one memory chip (e.g., RAM), and/or at least one processor chip (e.g., a microprocessor, a multi-core microprocessor, or graphics processor, or the like). In an embodiment, package device 550 is a microprocessor including an SRAM cache memory. In an embodiment, package device 550 includes one or more of transistor 120 or transistor 130 or both. For example, an employed transistor may include a channel region that comprises a germanium tin portion of a fin such that the fin may include a buffer layer disposed over a substrate and the germanium tin portion disposed over the buffer layer, a gate disposed over the channel region, and a source and a drain coupled to the fin such that the channel region is between the source and the drain. Packaged device 550 may be further coupled to (e.g., communicatively coupled to) a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller thereof 535. In general, packaged device 550 may be also be coupled to (e.g., communicatively coupled to) display screen 505.

Functionally, PMIC 530 may perform battery power regulation, DC-to-DC conversion, etc., and so has an input coupled to battery 515 and with an output providing a current supply to other functional modules. In an embodiment, PMIC 530 may perform high voltage operations. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 550 or within a single IC (SoC) coupled to the package substrate of the packaged device 550.

Figure 6:
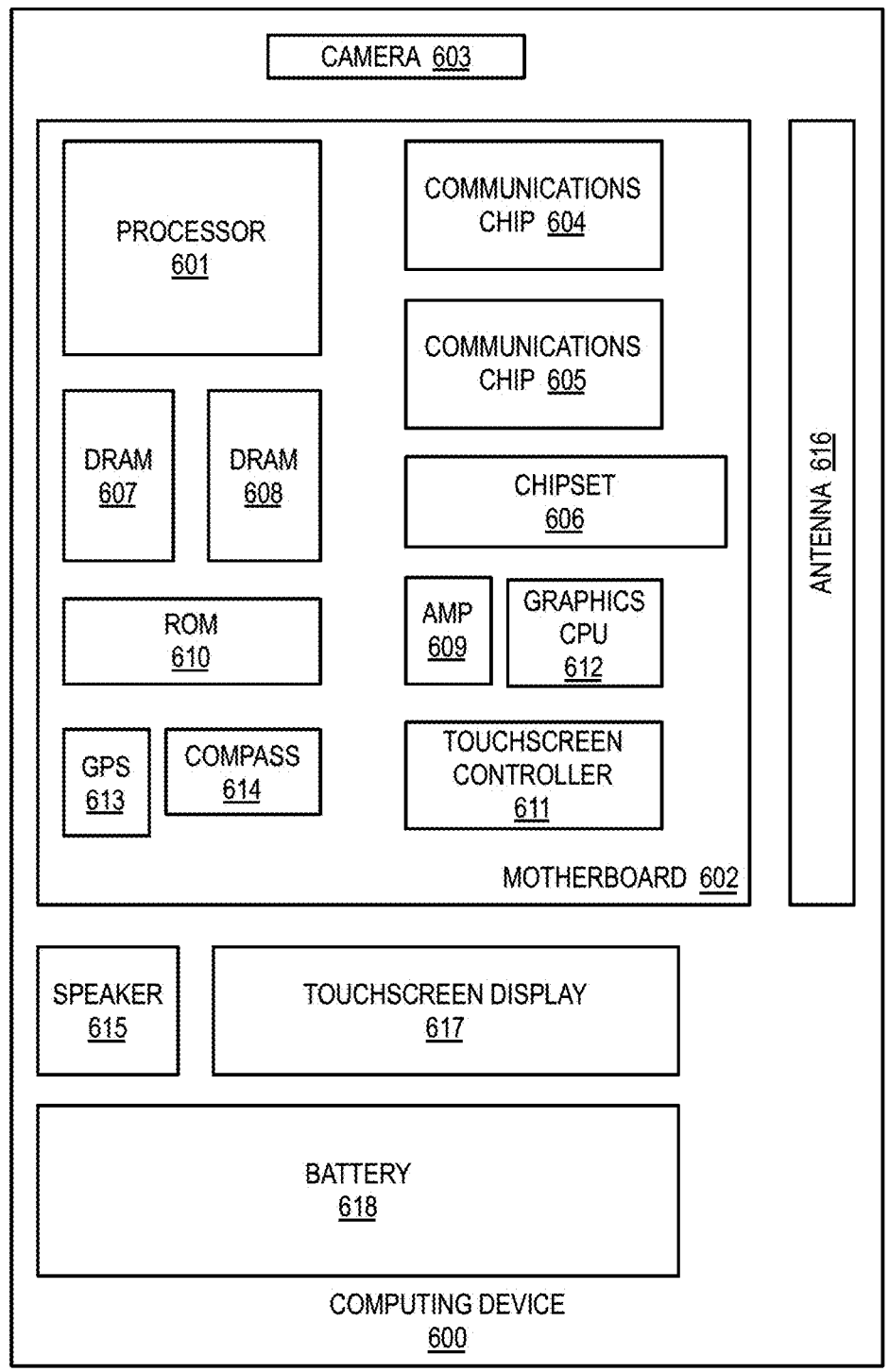
FIG. 6 is a functional block diagram of a computing device, all arranged in accordance with at least some implementations of the present disclosure.

FIG. 6 is a functional block diagram of a computing device 600, arranged in accordance with at least some implementations of the present disclosure. Computing device 600 may be found inside platform 500, for example, and further includes a motherboard 602 hosting a number of components, such as but not limited to a processor 601 (e.g., an applications processor) and one or more communications chips 604, 605. Processor 601 may be physically and/or electrically coupled to motherboard 602. In some examples, processor 601 includes an integrated circuit die packaged within the processor 601. In general, the term "processor" may refer to any device or portion of a device that processes electronic data from registers and/or memory to transform that electronic data into other electronic data that may be stored in registers and/or memory.

In various examples, one or more communication chips 604, 605 may also be physically and/or electrically coupled to the motherboard 602. In further implementations, communication chips 604 may be part of processor 601. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics processor 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 604, 605 may enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 604, 605 may implement any of a number of wireless standards or protocols, including but not limited to those described elsewhere herein. As discussed, computing device 600 may include a plurality of communication chips 604, 605. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, an integrated circuit comprises a transistor including a channel region that comprises a germanium tin portion of a fin, wherein the fin comprises a buffer layer disposed over a substrate and the germanium tin portion disposed over the buffer layer, a gate disposed over the channel region, and a source and a drain coupled to the fin, wherein the channel region is between the source and the drain.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, wherein the channel region and the second channel region comprise different concentrations of tin.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, wherein the channel region and the second channel region comprise different concentrations of tin, and wherein the transistor is an NMOS transistor and the second transistor is a PMOS transistor and wherein the channel region has a concentration of tin in the range of 5% to 10% and the second channel region has a concentration of tin in the range of 5% to 20%.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, wherein the channel region and the second channel region comprise different concentrations of tin, and wherein the transistor is an NMOS transistor and the second transistor is a PMOS transistor and wherein the channel region has a concentration of tin in the range of 5% to 10% and the second channel region has a concentration of tin in the range of 5% to 20%, and wherein the second channel region comprises a higher concentration of tin than the channel region.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, wherein the channel region and the second channel region comprise different concentrations of tin, wherein the transistor is an NMOS transistor and the second transistor is a PMOS transistor and/or wherein the channel region has a concentration of tin in the range of 5% to 10% and the second channel region has a concentration of tin in the range of 5% to 20% and/or wherein the second channel region comprises a higher concentration of tin than the channel region.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, a second gate disposed over the second channel region, and a second source and a second drain coupled to the second fin, wherein the second channel region is between the second source and the second drain, wherein the transistor is an NMOS transistor and the second transistor is a PMOS transistor, wherein the source, the drain, the second source, and the second drain all comprise germanium tin, and wherein the source and the drain comprise different concentrations of tin than the second source and the second drain.

Further to the first embodiments, the integrated circuit comprises a second transistor including a second channel region that comprises a second germanium tin portion of a second fin, wherein the second fin comprises a second buffer layer disposed over the substrate and the second germanium tin portion disposed over the second buffer layer, a second gate disposed over the second channel region, and a second source and a second drain coupled to the second fin, wherein the second channel region is between the second source and the second drain, wherein the transistor is an NMOS transistor and the second transistor is a PMOS transistor, wherein the source, the drain, the second source, and the second drain all comprise germanium tin, and wherein the source and the drain comprise different concentrations of tin than the second source and the second drain, and wherein the second source and the second drain comprise a higher concentration of tin than the source and the drain.

Further to the first embodiments, the buffer layer comprises an epitaxial layer of germanium.

Further to the first embodiments, the gate comprises an epitaxial layer of silicon adjacent to the channel region, a high-k gate dielectric, and a metal gate portion.

Further to the first embodiments, a bottom of the gate is substantially planar with a top surface of the buffer layer.

Further to the first embodiments, the buffer layer comprises an epitaxial layer of germanium and/or wherein the gate comprises an epitaxial layer of silicon adjacent to the channel region, a high-k gate dielectric, and a metal gate portion, and/or wherein a bottom of the gate is substantially planar with a top surface of the buffer layer.

Further to the first embodiments, the integrated circuit further comprises a second transistor including a second channel region that comprises a silicon portion of a second fin.

Further to the first embodiments, the integrated circuit further comprises a second transistor including a second channel region that comprises a silicon portion of a second fin, wherein the transistor comprises an NMOS transistor and the second transistor comprises a PMOS transistor.

Further to the first embodiments, the integrated circuit further comprises a second transistor including a second channel region that comprises a silicon portion of a second fin, wherein the transistor comprises an NMOS transistor and the second transistor comprises a PMOS transistor, and the integrated circuit further comprises a third transistor including a third channel region that comprises a second germanium tin portion of a third fin, wherein the third fin comprises a second buffer layer disposed over the substrate and the second germanium tin portion disposed over the second buffer layer, wherein the third transistor comprises a PMOS transistor.

Further to the first embodiments, the integrated circuit further comprises a second transistor including a second channel region that comprises a silicon portion of a second fin, wherein the transistor comprises an NMOS transistor and the second transistor comprises a PMOS transistor, and the integrated circuit further comprises a third transistor including a third channel region that comprises a second germanium tin portion of a third fin, wherein the third fin comprises a second buffer layer disposed over the substrate and the second germanium tin portion disposed over the second buffer layer, wherein the third transistor comprises a PMOS transistor, and wherein the channel region and the third channel region comprise different concentrations of tin.

In one or more second embodiments, an SRAM cell comprises an NMOS transistor including a first channel region that comprises a first germanium tin portion of a first fin, wherein the first fin comprises a first buffer layer disposed over a substrate and the first germanium tin portion disposed over the first buffer layer, a first gate disposed over the first channel region, and a first source and a first drain, each comprising germanium tin, coupled to the first fin, wherein the first channel region is between the first source and the first drain, and a PMOS transistor including a second channel region that comprises a second germanium tin portion of a second fin, wherein the second fin comprises a second buffer layer disposed over the substrate and the second germanium tin portion disposed over the second buffer layer, a second gate disposed over the second channel region, and a second source and a second drain, each comprising germanium tin, coupled to the second fin, wherein the second channel region is between the second source and the second drain, wherein the first source and the first drain comprise different concentrations of tin than the second source and the second drain.

Further to the second embodiments, the first channel region has a concentration of tin in the range of 5% to 10% and the second channel region has a concentration of tin in the range of 5% to 20%.

Further to the second embodiments, the first channel region has a concentration of tin in the range of 5% to 10% and the second channel region has a concentration of tin in the range of 5% to 20%, and the second source and the second drain comprise a higher concentration of tin than the first source and the first drain.

Further to the second embodiments, the first channel region has a concentration of tin in the range of 5% to 10% and the second channel region has a concentration of tin in the range of 5% to 20%, the second source and the second drain comprise a higher concentration of tin than the first source and the first drain, and the second channel region comprises a higher concentration of tin than the first channel region.

In one or more third embodiments, an SRAM cell comprises an NMOS transistor including a first channel region that comprises a first germanium tin portion of a first fin, wherein the first fin comprises a first buffer layer disposed over a substrate and the first germanium tin portion disposed over the first buffer layer, a first gate disposed over the first channel region, and a first source and a first drain coupled to the first fin, wherein the first channel region is between the first source and the first drain, and a PMOS transistor including a second channel region that comprises a second germanium tin portion of a second fin, wherein the second fin comprises a second buffer layer disposed over the substrate and the second germanium tin portion disposed over the second buffer layer; a second gate disposed over the second channel region, and a second source and a second drain coupled to the second fin, wherein the second channel region is between the second source and the second drain, wherein the first channel region comprise a different concentration of tin than the second channel region.

Further to the third embodiments, the first channel region has a concentration of tin in the range of 5% to 10% and the second channel region has a concentration of tin in the range of 5% to 20%.

Further to the third embodiments, the first channel region has a concentration of tin in the range of 5% to 10% and the second channel region has a concentration of tin in the range of 5% to 20% and the second channel region comprises a higher concentration of tin than the first channel region.

Further to the third embodiments, the buffer layer comprises an epitaxial layer of germanium.

Further to the third embodiments, a bottom of the first gate is substantially planar with a top surface of the first buffer layer.

Further to the third embodiments, the buffer layer comprises an epitaxial layer of germanium and wherein a bottom of the first gate is substantially planar with a top surface of the first buffer layer.

In one or more fourth embodiments, a method for fabricating an integrated comprises forming a fin having a buffer layer disposed over a substrate and a germanium tin portion disposed over the buffer layer, disposing a gate over the fin, and coupling a source and a drain to the fin, wherein the gate is between the source and the drain.

Further to the fourth embodiments, forming the fin comprises forming a trench in a patterned dielectric layer, epitaxially growing the buffer layer, wherein the buffer layer comprises germanium, epitaxially growing the germanium tin portion of the fin, and recessing the patterned dielectric layer such that a top surface of the patterned dielectric layer is substantially planar with a top surface of the buffer layer.

Further to the fourth embodiments, the method further comprises forming a second fin having a second buffer layer disposed over the substrate and a second germanium tin portion disposed over the second buffer layer, wherein the germanium tin portion and the second germanium tin portion comprise different concentrations of tin.

Further to the fourth embodiments, forming a second fin having a second buffer layer disposed over the substrate and a second germanium tin portion disposed over the second buffer layer, wherein the germanium tin portion and the second germanium tin portion comprise different concentrations of tin, wherein forming the second fin comprises forming a first sacrificial fin and a second sacrificial fin, disposing a dielectric layer adjacent to the first and second sacrificial fins, masking the first sacrificial fin, removing the second sacrificial fin to form a trench in the dielectric layer, epitaxially growing the second buffer layer within the trench, and epitaxially growing the second germanium tin portion within the trench.

Further to the fourth embodiments, the method further comprises forming a second fin having a second buffer layer disposed over the substrate and a second germanium tin portion disposed over the second buffer layer, disposing a second gate over the second fin, and coupling a second source and a second drain to the second fin, wherein the second gate is between the second source and the second drain, wherein the source, the drain, the second source, and the second drain all comprise germanium tin, and wherein the source and the drain comprise different concentrations of tin than the second source and the second drain.

Further to the fourth embodiments, the method further comprises forming a second fin having a second buffer layer disposed over the substrate and a second germanium tin portion disposed over the second buffer layer, disposing a second gate over the second fin, and coupling a second source and a second drain to the second fin, wherein the second gate is between the second source and the second drain, wherein the source, the drain, the second source, and the second drain all comprise germanium tin, and wherein the source and the drain comprise different concentrations of tin than the second source and the second drain, wherein coupling the second source and the second drain to the second fin comprises masking the fin, the gate, the source, and the drain and epitaxially growing the second source and the second drain.

In one or more fifth embodiments, a mobile computing platform comprises any of the example structures discussed with respect to the first, second, or third embodiments.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit comprising:
    a first transistor including:
        a first channel region that comprises a first germanium tin portion of a first fin, wherein the first fin comprises a first buffer layer disposed over a substrate and the first germanium tin portion disposed over the first buffer layer;
        a first gate disposed over the first channel region; and
        a first source and a first drain coupled to the first fin, wherein the first channel region is between the first source and the first drain; and
    a second transistor including:
        a second channel region that comprises a second germanium tin portion of a second fin, wherein the second fin comprises a second buffer layer disposed over the substrate and the second germanium tin portion disposed over the second buffer layer,
        wherein the first channel region and the second channel region comprise different concentrations of tin.

2. The integrated circuit of claim 1, wherein the first transistor is an NMOS transistor and the second transistor is a PMOS transistor and wherein the first channel region has a concentration of tin in the range of 5% to 10% and the second channel region has a concentration of tin in the range of 5% to 20%.

3. The integrated circuit of claim 2, wherein the second channel region comprises a higher concentration of tin than the channel region.

4. The integrated circuit of claim 1, wherein the second transistor further comprises:
    a second gate disposed over the second channel region; and
    a second source and a second drain coupled to the second fin, wherein the second channel region is between the second source and the second drain,
    wherein the first transistor is an NMOS transistor and the second transistor is a PMOS transistor, wherein the first source, the first drain, the second source, and the second drain all comprise germanium tin, and wherein the first source and the first drain comprise different concentrations of tin than the second source and the second drain.

5. The integrated circuit of claim 4, wherein the second source and the second drain comprise a higher concentration of tin than the first source and the first drain.

6. The integrated circuit of claim 1, wherein the buffer layer comprises an epitaxial layer of germanium.

7. The integrated circuit of claim 1, wherein the gate comprises an epitaxial layer of silicon adjacent to the channel region, a high-k gate dielectric, and a metal gate portion.

8. The integrated circuit of claim 1, wherein a bottom of the gate is substantially planar with a top surface of the buffer layer.

9. The integrated circuit of claim 1, further comprising a third transistor including:
   a third channel region that comprises a silicon portion of a third fin.

10. The integrated circuit of claim 9, wherein the first transistor comprises an NMOS transistor and the third transistor comprises a PMOS transistor.

11. An SRAM cell comprising:
   an NMOS transistor including:
      a first channel region that comprises a first germanium tin portion of a first fin, wherein the first fin comprises a first buffer layer disposed over a substrate and the first germanium tin portion disposed over the first buffer layer;
      a first gate disposed over the first channel region; and
      a first source and a first drain, each comprising germanium tin, coupled to the first fin, wherein the first channel region is between the first source and the first drain;
   a PMOS transistor including:
      a second channel region that comprises a second germanium tin portion of a second fin, wherein the second fin comprises a second buffer layer disposed over the substrate and the second germanium tin portion disposed over the second buffer layer;
      a second gate disposed over the second channel region; and
      a second source and a second drain, each comprising germanium tin, coupled to the second fin, wherein the second channel region is between the second source and the second drain,
   wherein the first source and the first drain comprise different concentrations of tin than the second source and the second drain.

12. The SRAM cell of claim 11, wherein the first channel region has a concentration of tin in the range of 5% to 10% and the second channel region has a concentration of tin in the range of 5% to 20%.

13. The SRAM cell of claim 12, wherein the second source and the second drain comprise a higher concentration of tin than the first source and the first drain.

14. The SRAM cell of claim 13, wherein the second channel region comprises a higher concentration of tin than the first channel region.

15. An integrated circuit comprising:
   a first transistor including:
      a first channel region that comprises a first germanium tin portion of a first fin, wherein the first fin comprises a first buffer layer disposed over a substrate and the first germanium tin portion disposed over the first buffer layer;
      a first gate disposed over the first channel region; and
      a first source and a first drain coupled to the first fin, wherein the first channel region is between the first source and the first drain; and
   a second transistor including:
      a second channel region that comprises a second germanium tin portion of a second fin, wherein the second fin comprises a second buffer layer disposed over the substrate and the second germanium tin portion disposed over the second buffer layer;
      a second gate disposed over the second channel region; and
      a second source and a second drain coupled to the second fin, wherein the second channel region is between the second source and the second drain,
   wherein the first transistor is an NMOS transistor and the second transistor is a PMOS transistor, wherein the first source, the first drain, the second source, and the second drain all comprise germanium tin, and wherein the first source and the first drain comprise different concentrations of tin than the second source and the second drain.

16. The integrated circuit of claim 15, wherein the second source and the second drain comprise a higher concentration of tin than the first source and the first drain.

17. The integrated circuit of claim 15, wherein the first channel region has a concentration of tin in the range of 5% to 10% and the second channel region has a concentration of tin in the range of 5% to 20%.

18. The integrated circuit of claim 17, wherein the second channel region comprises a higher concentration of tin than the first channel region.

19. The integrated circuit of claim 15, wherein the first buffer layer comprises an epitaxial layer of germanium.

20. The integrated circuit of claim 15, wherein the first gate comprises an epitaxial layer of silicon adjacent to the first channel region, a high-k gate dielectric, and a metal gate portion.

21. The integrated circuit of claim 15, wherein a bottom of the first gate is substantially planar with a top surface of the first buffer layer.

* * * * *